United States Patent [19]
Abe et al.

[11] Patent Number: 5,089,061
[45] Date of Patent: Feb. 18, 1992

[54] METHOD FOR PRODUCING HIGH SILICON STEEL STRIP IN A CONTINUOUSLY TREATING LINE

[75] Inventors: Masahiro Abe; Kazuhisa Okada; Shuzo Fukuda; Yasushi Tanaka; Masayuki Yamato; Yoshikazu Takada, all of Tokyo, Japan

[73] Assignee: NKK Corporation, Tokyo, Japan

[21] Appl. No.: 247,954

[22] Filed: Sep. 22, 1988

[51] Int. Cl.$^5$ .................................. H01F 1/04
[52] U.S. Cl. ........................ 148/110; 148/113
[58] Field of Search .................. 148/110–113

[56] References Cited

U.S. PATENT DOCUMENTS
3,423,253  1/1969  Ames et al. ..................... 148/113

FOREIGN PATENT DOCUMENTS
| | | | |
|---|---|---|---|
| 17692 | 1/1929 | Australia. | |
| 62-227032 | 10/1987 | Japan | 148/111 |
| 62-227033 | 10/1987 | Japan | 148/112 |
| 62-227034 | 10/1987 | Japan | 148/112 |
| 62-227035 | 10/1987 | Japan | 148/111 |
| 62-227036 | 10/1987 | Japan | 148/111 |
| 158914 | 12/1963 | U.S.S.R. | 148/113 |

*Primary Examiner*—John P. Sheehan
*Attorney, Agent, or Firm*—Nields & Lemack

[57] ABSTRACT

The present invention relates to a method for producing high silicon steel strip in a continuous treatment line through chemical vapor deposition (called "CVD" hereinafter), wherein the steel strip is subjected continuously to siliconization at temperatures between 1023° and 1200° C. by CVD in a non-oxidizing gas atmosphere containing $SiCl_4$ between 5% and 35% in molar fraction. Subsequently a diffusion treatment is performed in a non-oxidizing gas atmosphere not containing $SiCl_4$ for diffusing Si uniformly throughout the steel strip, which is then cooled and coiled. If required, the steel strip may be coated with an insolating film and subjected to a baking treatment, before cooling and coiling.

36 Claims, 9 Drawing Sheets

FIG_1
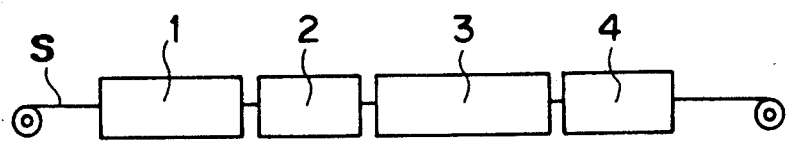
FIG_2
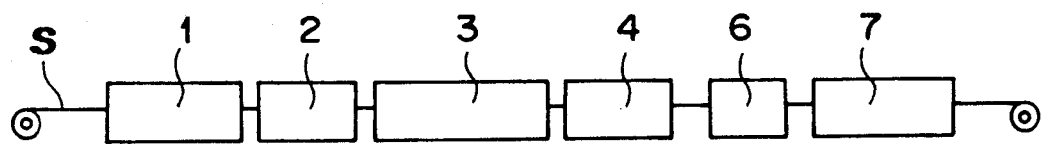
FIG_3
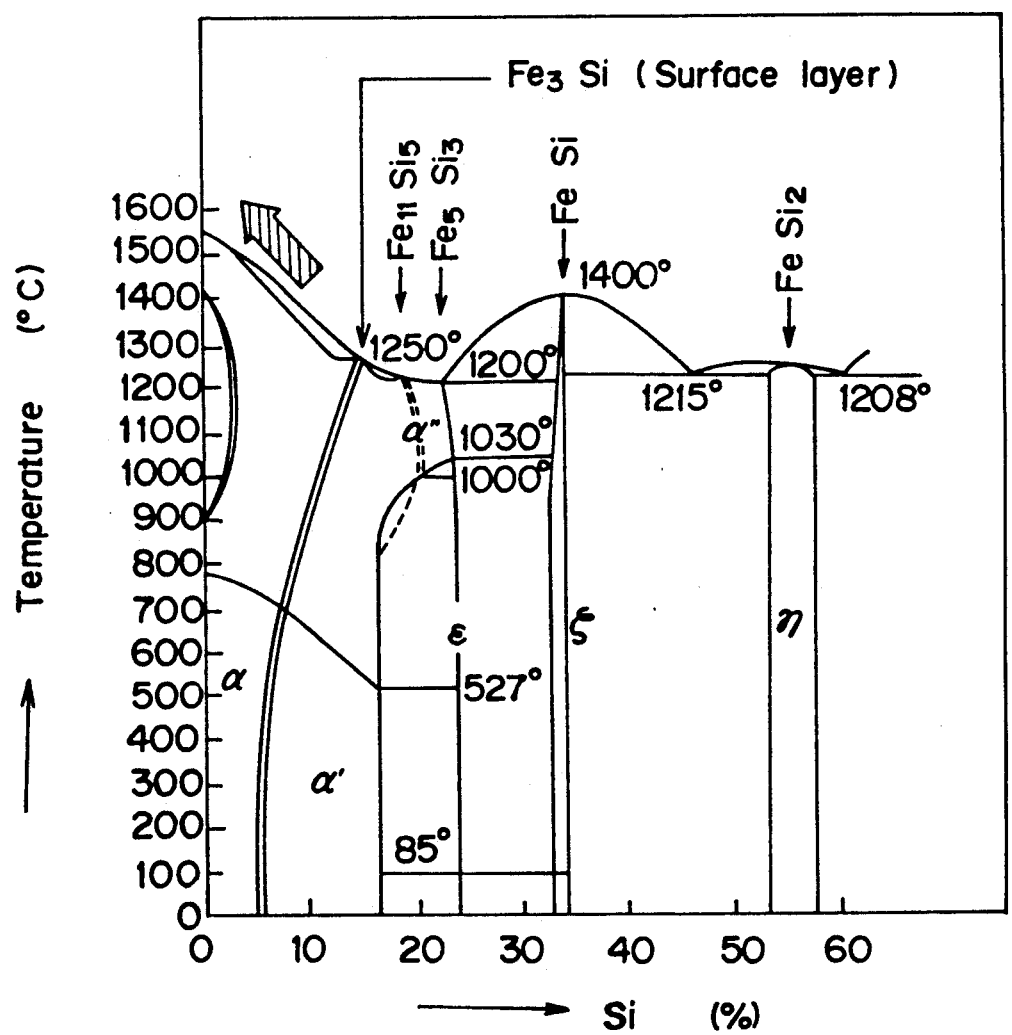

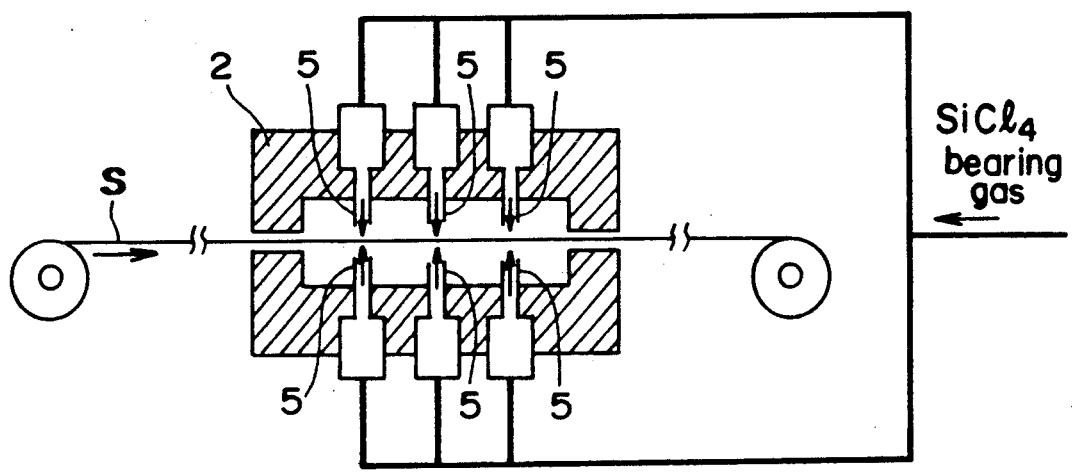
FIG_4
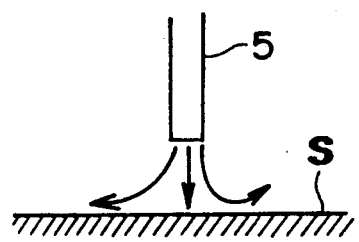
FIG_5(a)
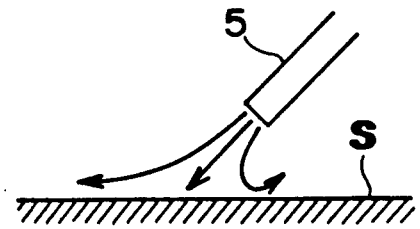
FIG_5(b)

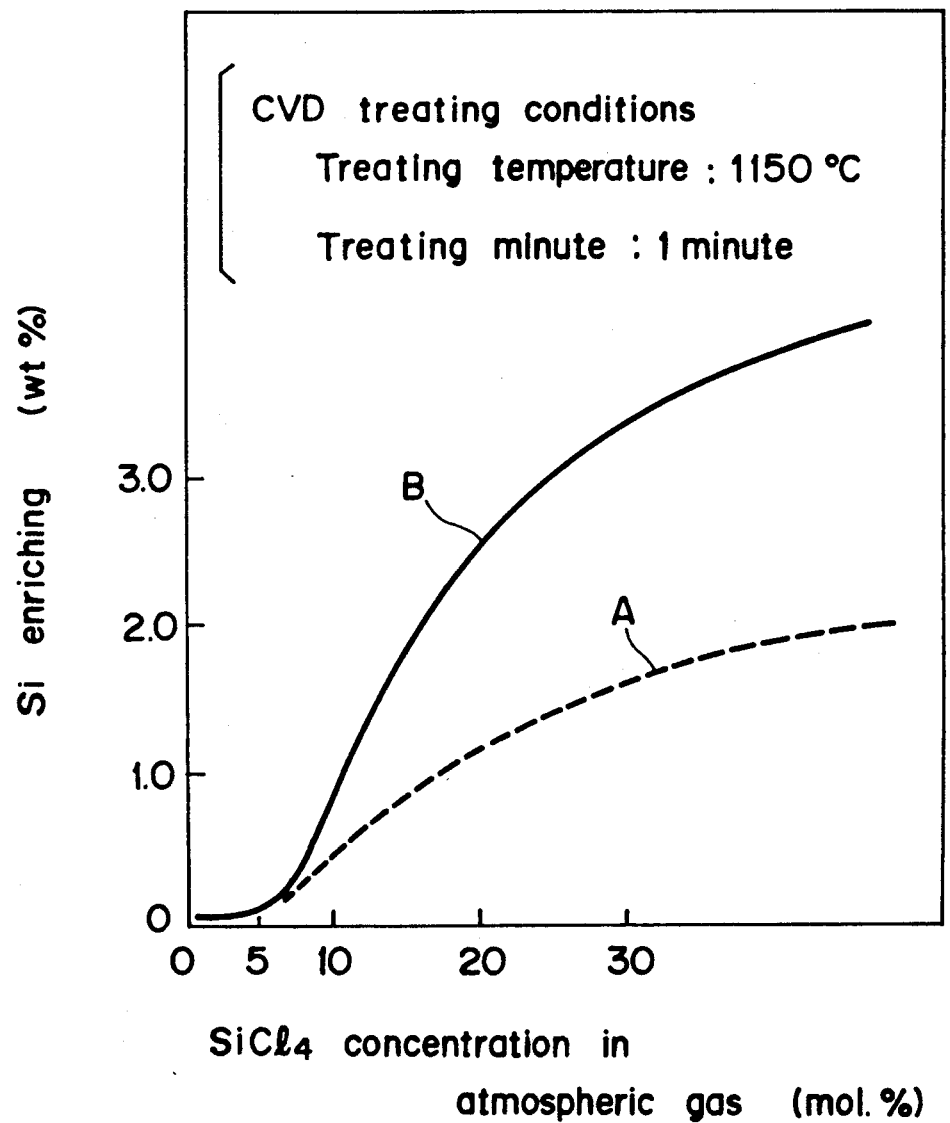

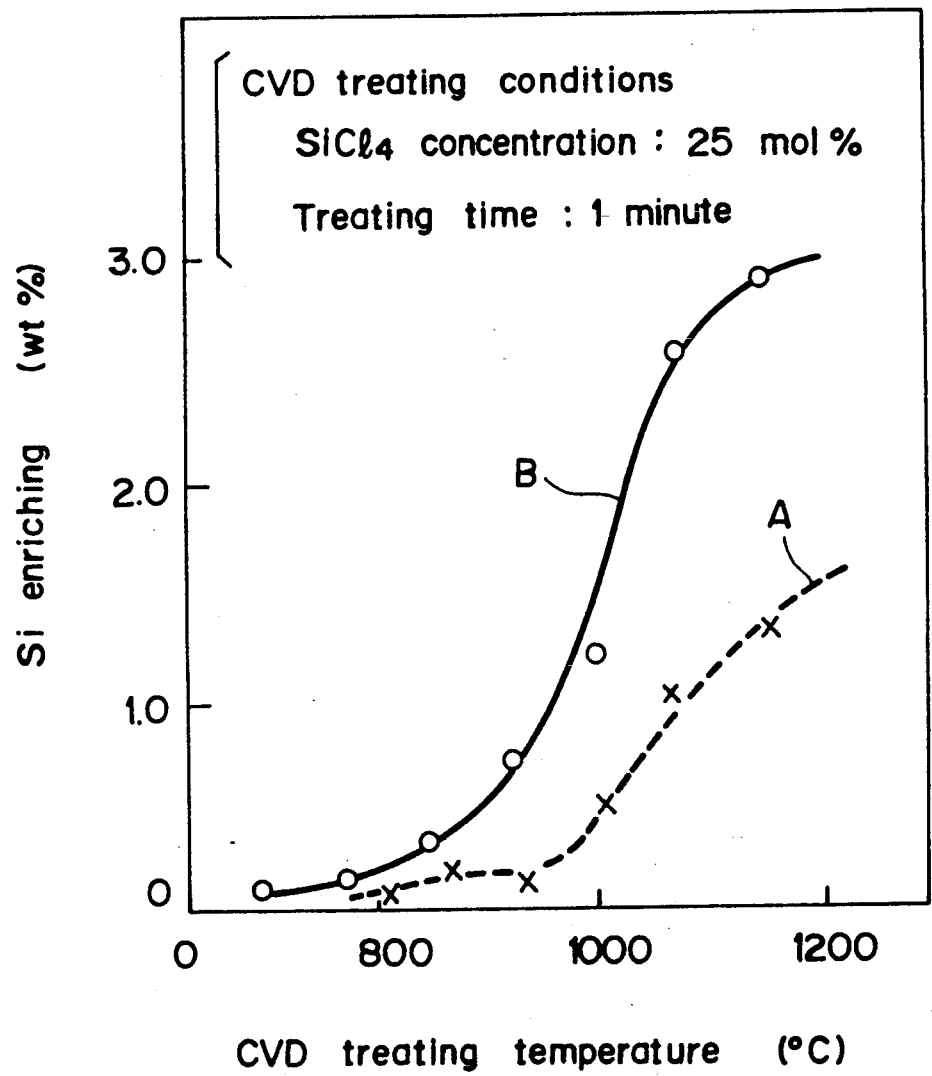

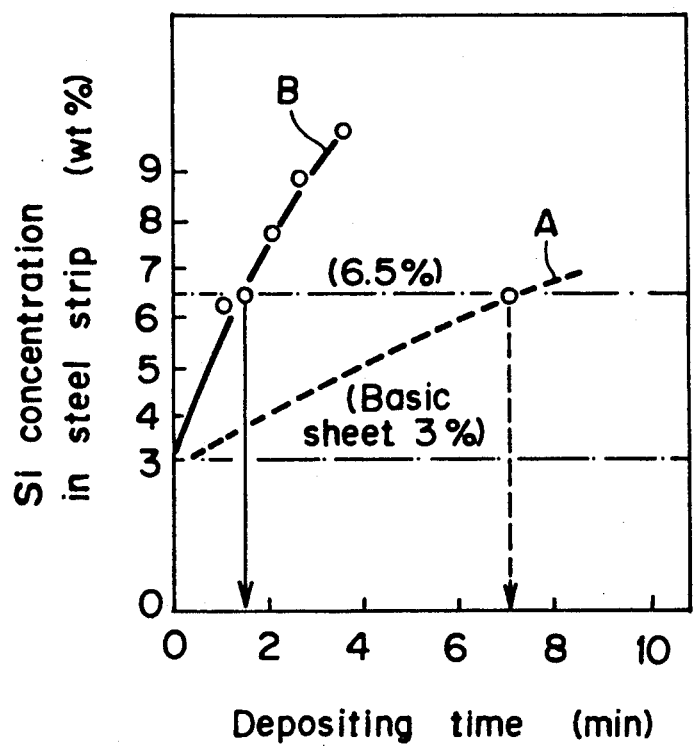
FIG_8
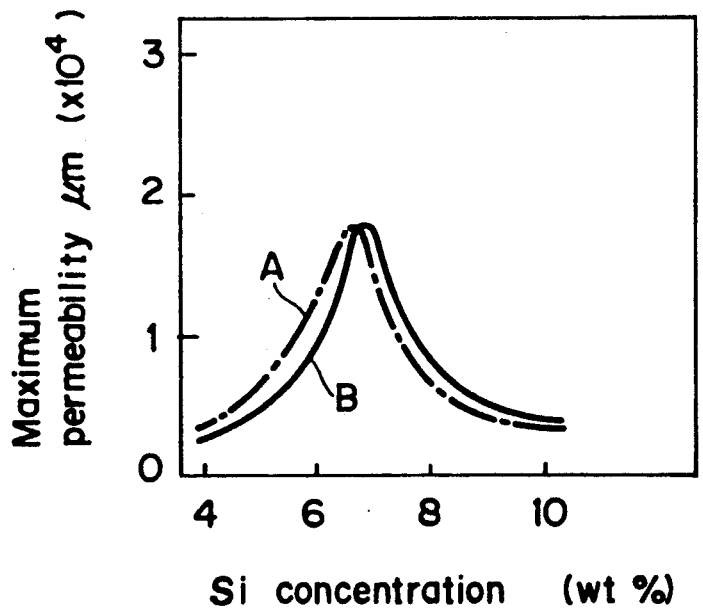
FIG_9

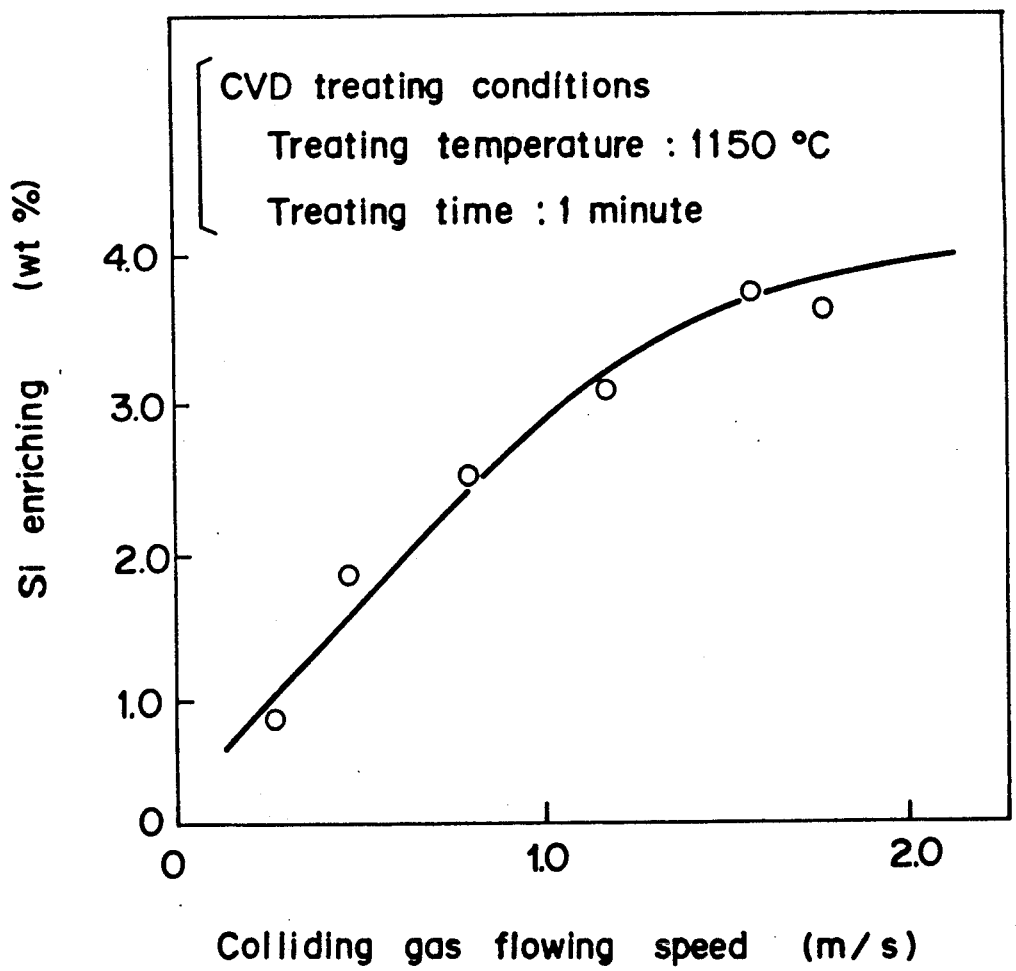
FIG_10

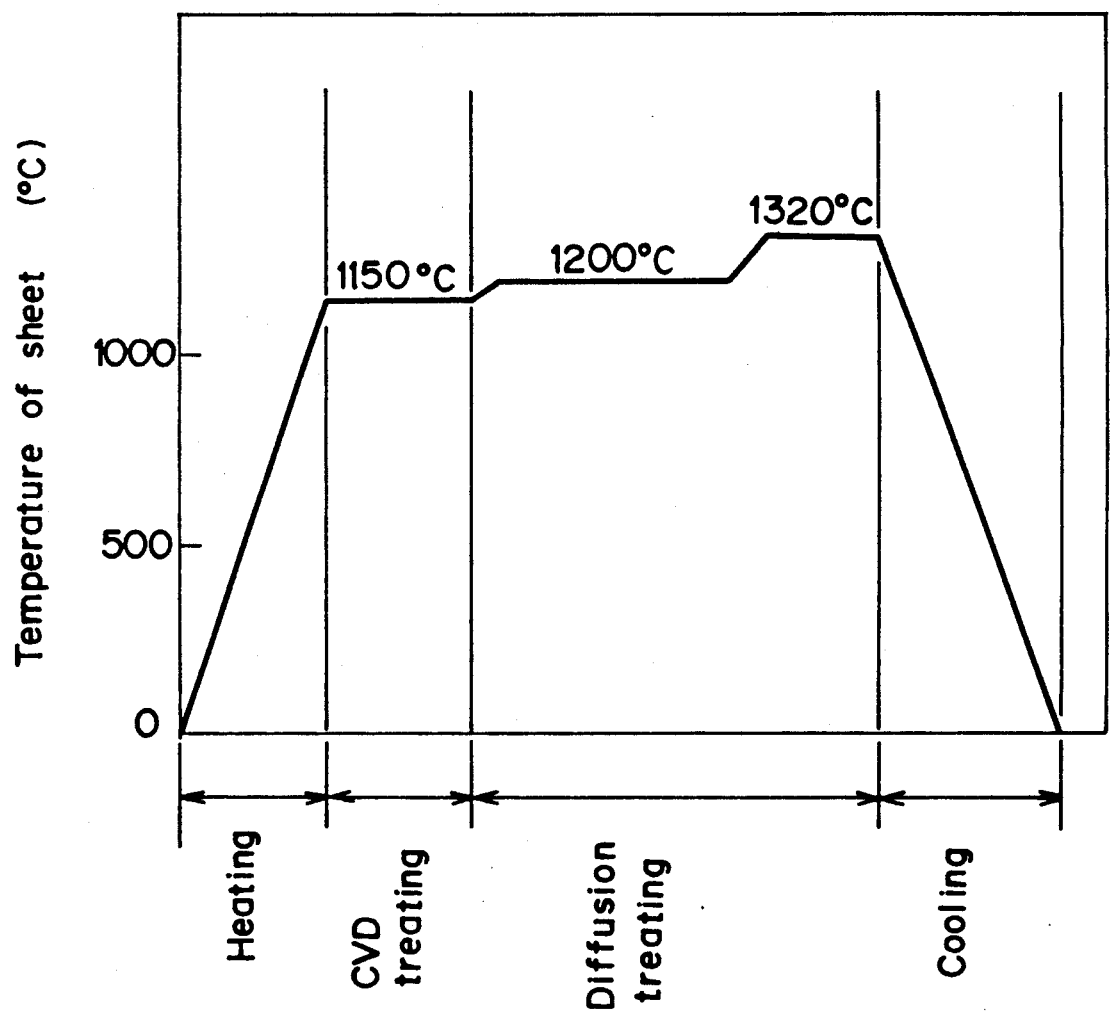
FIG_11

FIG_12
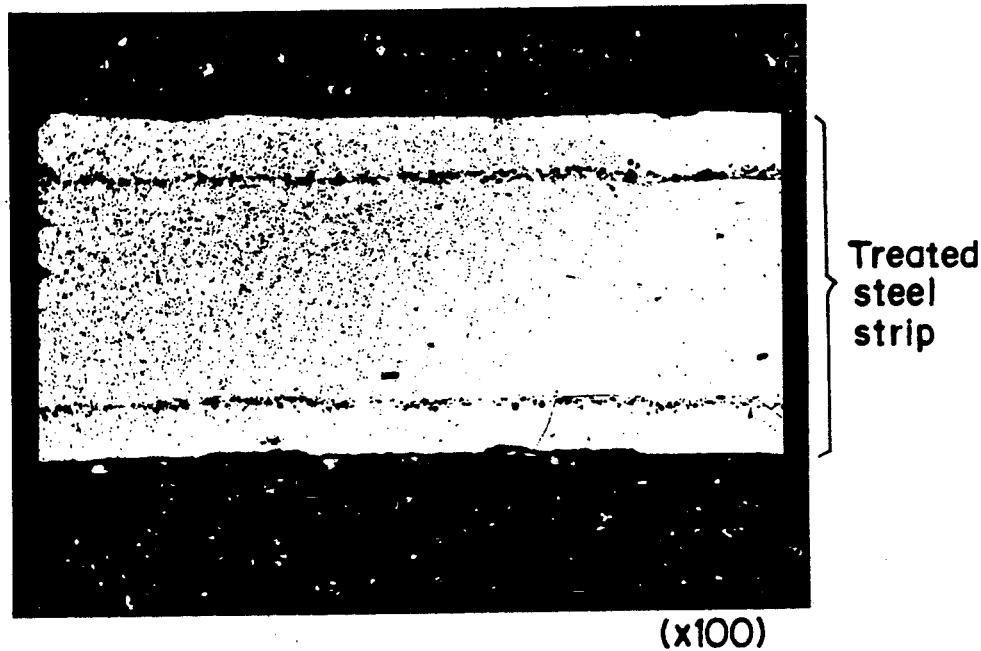
Treated steel strip
(x100)
FIG_13
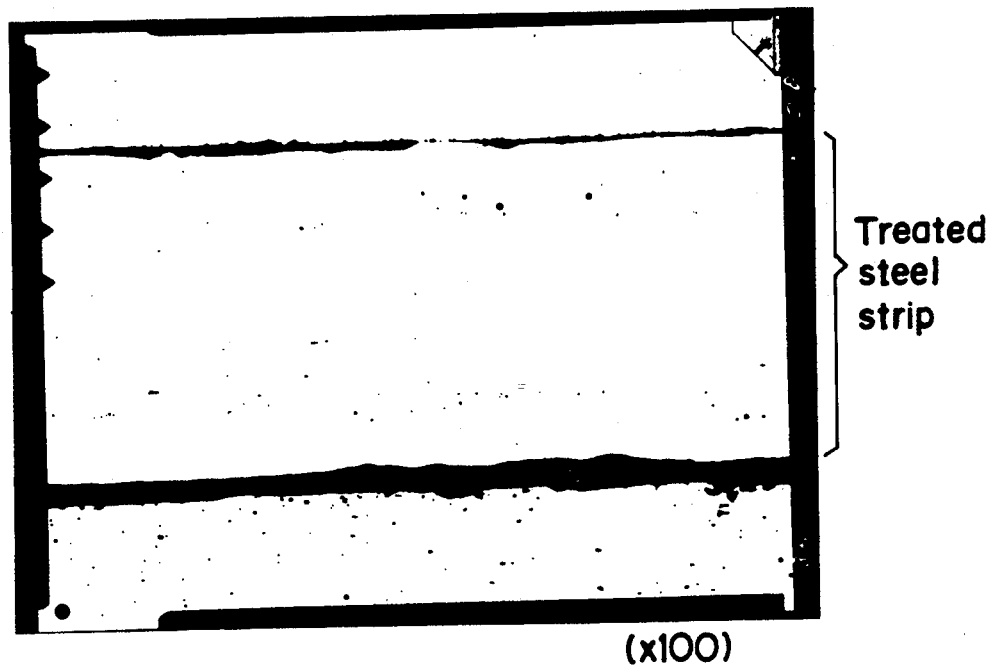
Treated steel strip
(x100)

FIG_14
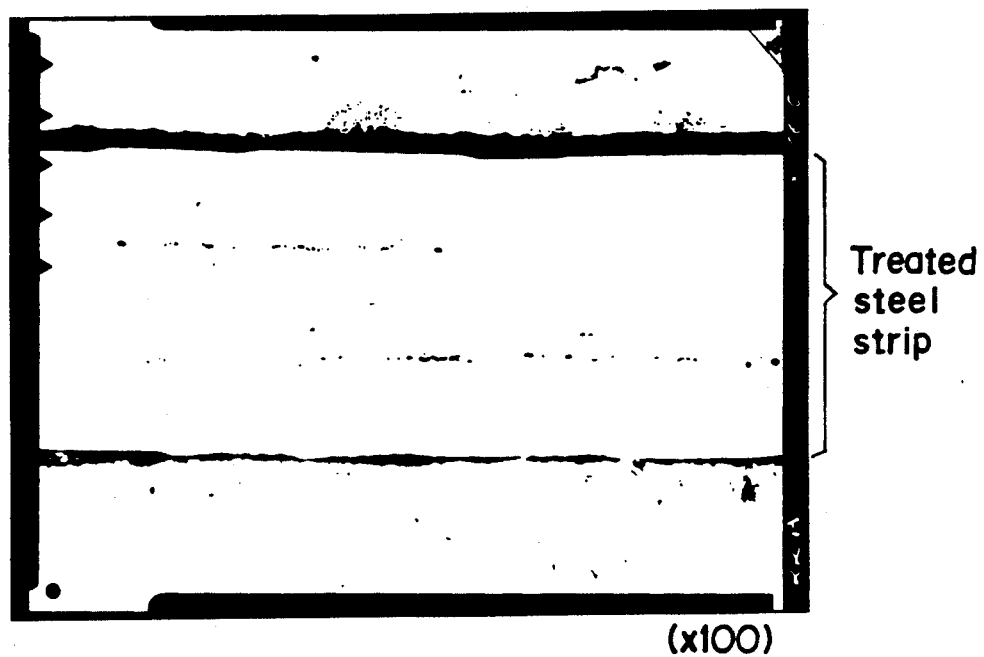
Treated steel strip
(x100)

METHOD FOR PRODUCING HIGH SILICON STEEL STRIP IN A CONTINUOUSLY TREATING LINE

BACKGROUND OF THE INVENTION

High silicon steel plate has been used for electromagnetic steel. It is known that with this kind of steel, the higher is the Si content, the lower is the hysteresis loss, and at an Si of 6.5 wt %, the magnetic strain is 0. Also Maximum magnetic permeability is exhibited.

For producing high silicon steel strip, several methods have been used; a rolling method, a direct casting method and a siliconizing method. The rolling method is generally not used when Si content exceeds about 4 wt %, because with higher Si content, cold working becomes difficult. The direct casting method, that is, strip casting does not suffer from this same difficulty associated with the rolling method, but deformation is a problem, making it especially difficult to produce high silicon steel strip of high quality.

On the other hand, the siliconizing method begins with a molten low silicon steel, rolls the steel into a thin strip, and applies Si to the surface thereof in such a way that it permeates the entire strip thereby avoiding both the problem workability and deformation.

Siliconizing methods have been proposed by Itsumi and Abe, and studied in detail by Mitsuya and Onishi. All of these proposed methods require appreciable time for siliconization, more than 30 minutes, and are therefore not generally useful for a continuous production line. Also, since the treatment temperature is very high, as much as 1230° C., the shape of thin steel sheets after siliconization is very bad; in addition, there is danger that the edge parts may melt owing to overheating because the treatment temperature is too high. Thus, one cannot plan on stable running of the strips in a continuous line environment.

The present invention seeks to avoid these shortcomings in the prior art using the siliconizing method to efficiently produce stable high silicon steel strip of high quality in a continuous process.

SUMMARY OF THE INVENTION

In the invention, steel strip is subjected continuously to siliconization at temperatures between 1023° and 1200° C. by CVD in a non-oxidizing gas atmosphere containing $SiCl_4$ between 5% and 35% in molar fraction. Subsequently a non-oxidizing gas atmosphere not containing $SiCl_4$ is used for diffusing the Si uniformly through the steel strip, which is then cooled and coiled. If a coating of isolation is required, the coating is applied after the above mentioned diffusion treatment, and baking treatment of the coating is carried out before cooling and coiling.

It is preferred to blow atmospheric $SiCl_4$ onto the steel strip through blowing nozzles, or forcibly circulate the gas by means of fans so as to accomplish siliconization uniformly and efficiently. As a result, surface of diffusion of the $SiCl_4$ occurs, releasing $FeCl_2$ as a by-product of the reaction. The film may be created at a relatively high deposition rate.

BRIEF DESCRIPTION OF THE DRAWINGS

FIG. 1 shows one embodiment of the continuous treatment line of the invention;

FIG. 2 shows another embodiments of the continuous treatment line of the invention;

FIG. 3 is a graph showing Fe vs. Si State;

FIG. 4 shows the CVD treatment by means of nozzles;

FIGS. 5(a) and (b) show alternative nozzle angles;

FIG. 6 shows relation of $SiCl_4$ in the CVD treatment of Si enriching rate in the steel strip;

FIG. 7 is graph showing the Si enrichment rate as a function of temperature;

FIG. 8 is a graph showing Si concentration in the steel strip as a function treatment time for both the atmospheric and the pressurized nozzle methods;

FIG. 9 is a graph showing permeability as a function of Si concentration for both the atmospheric method and the pressurized nozzle methods;

FIG. 10 is a graph showing Si concentration as a function of flow rate of the gas in the CVD treatment by the pressurized nozzle method;

FIG. 11 shows a heating cycle according to the invention; and

FIGS. 12 to 14 are enlarged microscopic photographs showing treated portions of steel strip, and in particular, FIG. 12 shows the structure of a sample immediately after CVD treatment in an atmosphere of 20% $SiCl_4$; FIG. 13 shows the structure after a diffusion heat treatment; and FIG. 14 shows the structure of a sample which has been subjected to CVD treatment with 40% $SiCl_4$, followed by a diffusion treatment.

In the drawings, 1 is a heating furnace, 2 is a CVD treatment furnace, 3 is a diffusion treatment furnace, 4 is a cooling apparatus, 6 is a coating apparatus, 7 is a baking furnace, and S is the steel strip.

DETAILED DESCRIPTION OF THE INVENTION

The composition of the steel strip to be used as the starting material is not especially critical to the invention, but it is preferred to use the following in order to obtain superior magnetic properties.

(1) 3 to 6.5 wt % Si—Fe alloy—
C: not more than 0.01 wt %, Si: 0 to 4.0 wt %;
Mn: not more than 2 wt %;
Unavoidable impurities: the lower, the better.

(2) Sendust alloy—
C: not more than 0.01 wt %, Si: not more than 4 wt % Al: 3 to 8 wt %, Ni: not more than 4 wt %, Mn: not more than 2 wt %; Elements for increasing corrosion resistance as Cr, Ti: not more than 5 wt %; Unavoidable impurities: the lower, the better.

The starting steel strip may be produced by either hot rolling, cold rolling or direct casting involving rapidly cooling solidification. Since the steel strip is reduced in thickness by the CVD treatment, attention must be paid to initial thickness in order to obtain desired thickness of the final product.

The steel strip S is heated without oxidization in the heating furnace 1 and introduced into the CVD treatment furnace for siliconization by the CVD method in a non-oxidizing atmosphere including $SiCl_4$. The non-oxidizing atmosphere including $SiCl_4$ is further defined to mean neutral or reducing gas, wherein Ar, $N_2$, He, $H_2$ or $CH_4$ may be used as carriers. The choice or carrier gas will be influenced by the fact that $H_2$ and $CH_4$ generate HCl as an exhaust component which is environmentally undesirable. For this reason AR, He and $N_2$ are preferred. Ar and He serve to limit nitriding of the material, which makes then especially preferable.

The main reaction on the surface of the steel strip in the CVD treatment is $$5Fe + SiCl_4 \rightarrow Fe_3Si + 2FeCl_2.$$

One atom of Si is deposited on the steel surface to form an $Fe_3Si$ film thereon, and two atoms of Fe serve to form $FeCl_2$ which is released in gaseous condition from the steel surface at a temperature of more than the melting point (1023° C.) of $FeCl_2$. Since the atomic weight of Si is 28.086 and the atomic weight of Fe is 55.847, the steel strip is reduced in mass and sheet thickness is reduced accordingly. By way of example, assuming that Si3% steel strip is the starting material from which Si 6.5% strip is made, mass is reduced approximately 8.7% and the sheet thickness is reduced about 7.1%.

In the inventor's investigations, the criteria for optimally performing the CVD treatment were found to be as follows:
(1) determining optimum $SiCl_4$ concentration in the atmospheric gas;
(2) determining optimum treatment temperature.
(3) accelerating the diffusion of $SiCl_4$ over the steel surface and release of $FeCl_2$ therefrom.

Accordingly, Si concentration in the atmospheric gas and treatment time for the CVD treatment have preferred values.

The preferred value for $SiCl_4$ concentration in the non-oxidizing gas atmospheric is 5% to 35% in molar fraction, and in such an atmosphere the steel strip is continuously treated by CVD.

With $SiCl_4$ of less than a5% in the atmosphere, it takes more than 5 minutes for enriching Si by 1.0% in the steel strip. As a result treatment time becomes excessive and so is impractical to achieve continuous processing. With $SiCl_4$ of more than 35%, the reaction at the boundary is rate-determined and a greater Si enriching effect is not possible.

Further, in the CVD treatment, the higher is $SiCl_4$, the more easily large voids called Kirkendall voids are created. These voids generally do not appear until $SiCl_4$ concentration is about 155. When $SiCl_4$ is below 35%, the voids can be completely eliminated by the diffusion treatment following CVD. In other words, if $SiCl_4$ concentration exceeds 35%, the voids remain even after the diffusion treatment.

FIG. 12 shows, in cross-section, the steel strip after CVD in a 20% $SiCl_4$ atmosphere and the voids which appear in the deposited film. FIG. 13 shows in cross section, the steel strip after having been subjected to a diffusion treatment of 1200° C. for 20 minutes. As shown the voids have virtually disappeared. On the other hand, FIG. 14 shows, in cross section, the steel strip having been subjected to a CVD treatment of 40% $SiCl_4$, followed by diffusion treatment. As shown in FIG. 14, the voids remain in layers.

The preferred treatment temperature is 1023° C. to 1200° C. Since the CVD treatment reaction takes place at the steel surface, this temperature range refers to steel surface temperature.

The melting point of $FeCl_2$, which is a product of the reaction by the CVD treatment is 1023° C. At temperatures below 1023° C., $FeCl_2$ is not released into the gaseous state from the steel surface but remains in the liquid state and hinders the deposition reaction.

Si enrichment rate increases considerably above the boiling point of $FeCl_2$, and since the deposition rate is also slow when the temperature is below 1023° C., it is difficult to employ the CVD treatment in a continuous process. Therefore, the preferred lower limit of the treatment temperature is 1023° C.

The reason for specifying the upper limit of temperature at 1200° C. is as follows. The melting point of $Fe_3Si$ is 1250° C., as shown in FIG. 3, but according to the inventors' experiments, if the CVD treatment is carried out at a temperature approximately 1230° C., the steel surface becomes partially molten due to overheating which is likewise true of the edges. The reason appears to be that Si is deposited on the steel surface more than 14.5% of Si concentration equivalent to $Fe_3Si$. On the other hand, if the treatment temperature is below 1200° C., the steel surface is not molten at all, and it is possible to control overheating at the edges by controlling the average temperatures at the center of the steel strip to be around 1220° C. For the above-mentioned reason, the preferred CVD treatment temperature is specified as between 1023° C. and 1200° C.

The steel strip S, having passed through the CVD treatment, is introduced into the diffusion furnace 3 for the diffusion treatment in the non-oxidizing gas atmosphere, not containing $SiCl_4$. That is, just after the CVD treatment, the Si concentration is high near the steel surface, but the Si concentration in the basic material remains unchanged appreciably. The diffusion treatment provides uniform Si concentration. The diffusion treatment must be performed in a non-oxidizing atmosphere to prevent oxidation of the steel surface. The higher is the temperature, the shorter is the treatment time.

The diffusion treatment may be carried out at constant temperature but as seen from the Fe vs. Si state diagram as shown in FIG. 3, Si concentration at the steel surface decreases as the diffusion proceeds, and the melting point increases. Accordingly, diffusion may be accelerated by increasing the temperature as the diffusion proceeds, but not to the extent that the steel strip becomes molten. For example, in the case of 6.5% Si steel, the surface temperature may be increased to 1400° C., without overheating the edge portions.

The steel strip S, after the diffusion treatment, is cooled in the cooling apparatus 4 and coiled at room temperature or under warm-working conditions such as 300° C. With respect to a steel strip having a higher Si content (e.g. more than 4.0 wt %), or greater thickness, or both, coiling at a warm-working temperature is preferred.

To increase the CVD treatment rate to the extent that continuous treatment of the steel strip may be achieved, it is necessary to determine optimum $SiCl_4$ concentration in the atmospheric gas and the optimum treatment temperature. In addition, it is possible to further increase the CVD treatment rate by accelerating the diffusion of $SiCl_4$ and the release of $FeCl_2$ from the steel surface.

In the prior art, if the reaction gas was moved largely in the CVD treatment, voids were created in the deposited film, which adversely affected the purity. Thus the Si concentration had to be kept to a necessary minimum. Under these conditions, it was found that diffusion of the reaction gas and the release of the reacted by-product could not be effected smoothly. Also, treatment time was undesirably long, and the concentration of the reaction gas was non-uniform in the CVD treating furnace, thereby contributing to non-uniformities in the deposited film.

In the process according to our invention, the atmosphere gas is blown onto the surface of the material to be process by means of nozzles within the CVD treating furnace, or is forcibly circulated by means of fans. In this way, the diffusion and release of by-products are accelerated considerably, so that the CVD treatment may be carried out at a relatively high deposition rate, thereby greatly improving uniformity of the deposited film.

Thus, the improvement achieve in the CVD treatment are, at least in part, attributable to the blowing of the atmospheric gas such as by means of nozzles. FIG. 4 shows the nozzle blowing practice, where the nozzles 5 are installed adjacent the steel surface S in the CVD treating furnace 2, and the atmospheric gas including $SiCl_4$ is blown thereunto. FIG. 5(a) and FIG. 5(b) show respectively the gas being blown vertically and obliquely with respect to the steel surface.

The Si enrichment rate, using this technique, is increased in proportion to the collision speed of the gas against the steel surface, but if the flow rate is increased too much, it is determined at the boundaries, and therefore a greater Si enriching effect cannot be obtained. In general, a flow rate of not more than 5 Nm/sec will being about satisfactory results (Nm/sec is the gas flow rate at a temperature of 0° C. under 1 atmospheric pressure, in meters/second under the standard condition).

After diffusion and cooling, the steel strip may be coated with an isolating film, baked and coiled. FIG. 2 shows the continuous treatment line therefor, where 6 is a coating apparatus and 7 is a paint baking furnace.

The electromagnetic steel strip is often used in laminated layers which are insulated from one another which is generally the reason why it is coated with an insulating film. Steel strip of more than 4.0 wt % Si is brittle at room temperature, and cannot be deformed elastically, to any appreciable degree. So, if the insulating film coating process is carried out in the CVD treatment zone or the other zone steel strip is sometimes broken when uncoiling and coiling. According to the invention therefore, only after diffusion and cooling is the insulating paint coated onto the steel strip S by the coating apparatus 6 and baked in the baking furnace 7.

For the insulating coating, an inorganic or organic type may be used appropriately. The inorganic coating may be phosphoric acid magnesium, anhydrous chromium acid or silica sol. A suitable organic coating can be obtained with plastic resin. The coating may be produced with a roll coater or a spray, and may be baked at a temperature of about 800° C. for the inorganic paint, and at from 200° C. to 300° C. for the organic paint.

In the heating furnace 1, a non-oxidizing atmosphere is used. Therefore, various heating devices such as electric indirect heating, conductive heating, induction heating, radiant tube indirect heating, and direct flaming reduction heating, may be employed single or in combination. When indirect heating is used, an electric cleansing is performed before heating. The methods of heating for such pre-treatments may be as follows:

(1) Pre-treating—(pre-heating)—electric indirect heating (or induction)

(2) Pre-treating—(pre-heating)—radiant tube heating—electric indirect heating (or induction heating)

(3) (Pre-heating)—direct flaming reduction heating—electric indirect electric heating (or induction heating)

(4) Preheating—(preheating)—radiant tube indirect heating (ceramic radiant tube)

(5) (preheating)—direct flaming reduction heating

The method of cooling used in the cooling apparatus 4 is not especially critical and there may be employed either single or combination, gas jet cooling, mist cooling and radiant cooling.

The present invention is, as mentioned above, suitable for the production of steel strip containing high silicon such as 6.5 wt %. The production of silicon steel strip of around 2 wt % to 4 wt % which, in the prior art, was subject to considerable deformation and low yield, in the case of the rolling, can be produced relative easily according to the invention.

As stated above, according to the present invention, the CVD treatment may be embodied in continuous process line wherein the treatment time is relatively short. Since the treatment takes place at temperature below 1200° C., the steel strip is not subject to deformation or melting at the edges. This permits the treatment line to be relatively short, leading to increased efficiency.

EXAMPLE 1

The CVD treatment furnace—a diffusion treatment furnace of small size was used, and a study was made of the influences of $SiCl_4$ concentration and the CVD treating temperatures on CVD treatment characteristics. Results are shown in FIGS. 6 and 7. In FIGS. 6 and 7, "A" designates the atmospheric method wherein the CVD treatment is carried out without the use of nozzles, and "B" designates a process wherein the atmospheric gas is blown through nozzles against the steel surface at a flow rate of 0.5 m/sec. "Si enrichment rate" means increase of Si, after CVD treatment and diffusion treatment, with respect to the original Si concentration of the basic material.

According to this, a large Si enrichment effect was obtained with an $SiCl_4$ concentration of more than 5% and with a (CVD treatment temperature of more than 1023° C. However, under these same conditions, the Si enrichment effect (CVD treatment ability) was superior with nozzle blowing of the atmospheric gas rather than the practice of merely passing the strip through the atmosphere.

FIG. 8 shows the relation between the deposition time and Si concentration (after the diffusion treatment) in the steel strip with respect to the atmosphere method "A" and the nozzle blowing method "B", when steel strip of 3 wt % Si and 0.5 mm thickness was treated at $SiCl_4$ concentration of 21% and at a treatment temperature of 1150° C. In the nozzle blowing method, the atmospheric gas was blown at a flow rate of 0.2 Nm/sec through slitted nozzles in a vertical orientation with respect to the steel strip. As is seen from FIG. 8, the atmospheric method "A" takes 7 minutes for 6.5% Si, steel, while the nozzle blowing method "B" takes 1.5 minutes.

FIG. 9 shows the magnetic properties of the steel strip thereby obtained.

FIG. 10 shows the relation between the gas collision speed of the nozzle blowing method and the Si enrichment rate of the steel strip after the diffusion treatment. The Si enriching rate increases as a function of the collision speed until a predetermined level is reached.

EXAMPLE 2

From a basic material of 0.35 mm thickness, 900 mm width and 3.5% Si, steel strip of 6.5% Si was produced at a line speed of 25 mpm. In the CVD treatment furnace, atmospheric gas of 20 mol % SiCl$_4$ concentration was blown by nozzles onto the steel strip at a flow rate of 0.3 Nm/sec, with Ar as the carrier gas.

FIG. 11 shows a heating cycle over time, and in this example, two stepped temperature increases from 1200° C. to 1320° C. were effected. As result, 6.5% Si steel strip of low iron loss such as W$_{10/50}$: W/kg was produced.

What is claimed is:

1. A method of producing high silicon steel strip in a continuous line, comprising continuously siliconizing a steel strip by a chemical vapor deposition at temperatures between 1023° and 1200° C. in a non-oxidizing gas atmosphere containing SiCl$_4$ 5 to 35% in molar fraction, and subsequently subjecting the strip to a diffusion treatment so as to uniformly diffuse Si in the steel strip in a non-oxidizing gas atmosphere not containing SiCl$_4$, in which diffusion treatment, increasing the temperature of the steel strip to an extent that the steel strip is not molten, cooling after the diffusion treatment, and coiling.

2. A method of producing high silicon steel strip in a continuous line, comprising continuously siliconizing a steel strip by a chemical vapor deposition at temperatures between 1023° and 1200° C. in a non-oxidizing atmosphere of a gas containing SiCl$_4$ 5 to 35% in molar fraction a pressurized stream of said gas being applied continuously to the steel surface via blowing nozzles, and subsequently subjecting the strip to a diffusion treatment so as to uniformly diffuse Si staying on the steel surface in the steel strip in a non-oxidizing gas atmosphere not containing SiCl$_4$, in which diffusion treatment, increasing the temperature of the steel strip to an extent that the steel s trip is not molten, cooling after the diffusion treatment, and coiling.

3. A method of producing high silicon steel strip in a continuous line, comprising continuously siliconizing a steel strip by a chemical vapor deposition at temperatures between 1023° and 1200° C. in a non-oxidizing gas atmosphere containing SiCl$_4$ 5 to 35% in molar fraction, while forcibly circulating the atmospheric gas by means of fans, and subsequently subjecting the strip to a diffusion treatment so as to uniformly diffuse Si in the steel strip in a non-oxidizing gas atmosphere not containing SiCl$_4$, in which diffusion treatment, increasing the temperature of the steel strip to an extent that the steel strip is not molten, cooling after the diffusion treatment, and coiling.

4. The method as claimed in claim 1, 2 or 3, comprising cooling the steel strip after the diffusion treatment, and coiling it under a warm-working condition at temperature of not more than 300° C.

5. The method as claimed in claim 2, comprising blowing the atmospheric gas against the steel strip from the blowing nozzles at flowing speed of not more than 5 Nm/sec.

6. The method as claimed in claim 2, comprising disposing a plurality of blowing nozzles along both sides of a steel strip running line in the chemical vapor desposition treating furnace, and blowing the atmospheric gas against the running steel strip.

7. A method of producing high silicon steel strip in a continuous line, comprising continuously siliconizing a steel strip composed of C: not more than 0.01 wt %, Si: not more than 4.0 wt %, Mn: not more than 2 wt %, the rest being Fe and inavoidable impurities, by a chemical vapor deposition at temperatures between 1023° and 1200° C. in a non-oxidizing gas atmosphere containing SiCl$_4$ 5 to 35% in molar fraction, and subsequently subjecting the strip to a diffusion treatment so as to uniformly diffuse Si in the steel strip in a non-oxidizing gas atmosphere not containing SiCl$_4$, in which diffusion treatment, increasing the temperature of the steel strip to an extent that the steel strip is not molten, cooling after the diffusion treatment, and coiling, 8. A method of producing high silicon steel strip in a continuous line, comprising continuously siliconizing steel strip composed of C: not more than 0.01 wt %, Si: not more than 4.0 wt %, Mn: not more than 2 wt %, the rest being Fe and inavoidable impurities by a chemical vapor deposition at temperatures between 1023° and 1200° C. in a non-oxidizing atmosphere of a gas containing SiCl$_4$ 5 to 35% in molar fraction, a pressurized stream of said gas being applied continuously to the steel surface via blowing nozzles, and subsequently subjecting the strip to a diffusion treatment so as to uniformly diffuse Si staying on the steel surface in the steel strip in a non-oxidizing gas atmosphere not containing SiCl$_4$, in which diffusion treatment, increasing the temperature of the steel strip to an extent that the steel strip is not molten, cooling after the diffusion treatment, and coiling.

9. A method of producing high silicon steel strip in a continuous line, comprising continuously siliconizing a steel strip composed of C: not more than 0.01 wt %, Si: not more than 4.0 wt %, Mn: not more than 2 wt %, the rest being Fe and inavoidable impurities by a chemical vapor deposition at temperatures between 1023° and 1200° C. in a non-oxidizing gas atmosphere containing SiCl$_4$ 5 to 35% in molar fraction, while forcibly circulating the atmospheric gas by means of fans, and subsequently subjecting the strip to a diffusion treatment so as to uniformly diffuse Si in the steel strip in a non-oxidizing gas atmosphere not containing SiCl$_4$, in which diffusion treatment, increasing the temperature of the steel strip to an extent that the steel strip is not molten, cooling after the diffusion treatment, and coiling.

10. The method as claimed in claim 7, 8 or 9, comprising cooling the steel strip after the diffusion treatment, and coiling it under a warming condition at temperature of not more than 300° C.

11. The method as claimed in claim 8, comprising blowing the atmospheric gas against the steel strip from the blowing nozzles at flowing speed of not more than 5 Nm sec.

12. The method as claimed in claim 8, comprising disposing a plurality of blowing nozzles along both sides of a steel strip running line in the chemical vapor desposition treating furnace, and blowing the atmospheric gas against the running steel strip.

13. A method of producing high silicon steel strip in a continuous line, comprising continuously siliconizing a steel strip composed of C: not more than 0.01 wt %, Si: not more than 4.0 wt %, Al: 3 to 8 wt %, Ni: not more than 4 wt %, Mn: not more than 2 wt %, corrosion resistance improving elements such as Cr, Ti: not more than 5 wt % in total, the rest being Fe and inavoidable impurities by a chemical vapor deposition at temperatures between 1023° and 1200° C. in a non-oxidizing gas atmosphere containing SiCl$_4$ 5 to 35% in molar fraction, and subsequently subjecting the strip to a diffusion treatment so as to uniformly diffuse Si in the steel strip in a non-oxidizing gas atmosphere not containing SiCl$_4$, in which diffusion treatment, increasing the temperature of the steel strip to an extent that the steel strip is not molten, cooling after the diffusion treatment, and coiling.

14. A method of producing high silicon steel strip in a continuous line, comprising continuously siliconizing a steel strip composed of C: Not more than 0.01 wt %, Si: not more than 4.0 wt %, Al: 3 to 8 wt %, Ni: not more than 4 wt %, Mn: not more than 2 wt %, corrosion resistance improving elements such as Cr, Ti: not more than 5 wt % in total, the rest being Fe and inavoidable impurities by a chemical vapor deposition at temperatures between 1023° and 1200° C. in a non-oxidizing atmosphere of a gas containing $SiCl_4$ 5 to 35% in molar fraction, a pressurized stream of said gas being applied continuously to the steel surface via blowing nozzles, and subsequently subjecting the strip to a diffusion treatment so as to uniformly diffuse Si staying on the steel surface in the steel strip in a non-oxidizing gas atmosphere not containing $SiCl_4$, in which diffusion treatment, increasing the temperature of the steel strip to an extent that the steel strip is not molten, cooling after the diffusion treatment, and coiling.

15. A method of producing high silicon steel strip in a continuous line, comprising continuously siliconizing a steel strip composed of C: not more than 0.01 wt %, Si: not more than 4.0 wt %, Al: 3 to 8 wt %, Ni: not more than 4 wt %, Mn: not more than 2 wt %, corrosion resistance improving elements such as Cr, Ti: not more than 5 wt % in total, the rest being Fe and inavoidable impurities by a chemical vapor deposition at temperatures between 1023° and 1200° C. in a non-oxidizing gas atmosphere containing $SiCl_4$ 5 to 35% in molar fraction, while forcibly circulating the atmospheric gas by means of fans, and subsequently subjecting the strip to a diffusion treatment so as to uniformly diffuse Si in the steel strip in a non-oxidizing gas atmosphere not containing $SiCl_4$, in which diffusion treatment, increasing the temperature of the steel strip to an extent that the steel strip is not molten, cooling after the diffusion treatment, and coiling.

16. The method as claimed in claim 13, 14 or 15, comprising cooling the steel strip after the diffusion treatment, and coiling it under a warming condition at temperature of not more than 300° C.

17. The method as claimed in claim 14, comprising blowing the atmospheric gas against the steel strip from the blowing nozzles at flowing speed of not more than 5 Nm/sec.

18. The method as claimed in claim 14, comprising disposing a plurality of blowing nozzles along both sides of a steel strip running line in the chemical vapor desposition treating furnace, and blowing the atmospheric gas against the running steel strip.

19. A method of producing high silicon steel strip in a continuous line, comprising continuously siliconizing a steel strip by a chemical vapor deposition at temperatures between 1023° and 1200° C. in a non-oxidizing gas atmosphere containing $SiCl_4$ 5 to 35% in molar fraction, and subsequently subjecting the strip to a diffusion treatment so as to uniformly diffuse Si in the steel strip in a non-oxidizing gas atmosphere not containing $SiCl_4$, in which diffusion treatment, increasing the temperature of the steel strip to an extend that the steel strip is not molten, coating, after cooling an insulating film, baking and coiling.

20. A method of producing high silicon steel strip in a continuous line, comprising continuously siliconizing a steel strip by a chemical vapor deposition at temperatures between 1023° and 1200° C. in a non-oxidizing atmosphere of a gas containing $SiCl_4$ 5 to 35% in molar fraction, a pressurized stream of gas being applied continuously to the steel surface via blowing nozzles, and subsequently subjecting the strip to a diffusion treatment so as to uniformly diffuse Si staying on the steel surface in a steel strip in a non-oxidizing gas atmosphere not containing $SiCl_4$, in which diffusion treatment, increasing the temperature of the steel strip to an extent that the steel strip is not molten, cooling after the diffusion treatment, coating, after cooling, an insulating film, baking and coiling.

21. A method of producing high silicon steel strip in a continuous line, comprising continuously siliconizing a steel strip by a chemical vapor deposition at temperatures between 1023° and 1200° C. in a non-oxidizing gas atmosphere containing $SiCl_4$ 5 to 35% in molar fraction, while forcibly circulating the atmospheric gas by means of fans, and subsequently subjecting the strip to a diffusion treatment so as to uniformly diffuse Si in the steel strip in a non-oxidizing gas atmosphere not containing $SiCl_4$, in which diffusion treatment, increasing the temperature of the steel strip to an extent that the steel strip is not molten, cooling after the diffusion treatment, coating, after cooling, an insulating film, baking and coiling.

22. The method as claimed in claim 19, 20 or 21, comprising cooling the steel strip after the diffusion treatment, and coiling it under a warming condition at temperature of not more than 300° C.

23. The method as claimed in claim 20, comprising blowing the atmospheric gas against the steel strip from the blowing nozzles at flowing speed of not more than 5 Nm/sec.

24. The method as claimed in claim 20, comprising disposing a plurality of blowing nozzles along both sides of a steel strip running line in he chemical vapor deposition treating furnace, and blowing the atmospheric gas against the running steel strip.

25. A method of producing high silicon steel strip in a continuous line, comprising continuously siliconizing a steel strip composed of C: not more than 0.01 wt %, Si: not more than 4.0 wt %, Mn: not more than 2 wt %, the rest being Fe and unavoidable impurities by a chemical vapor deposition at temperatures between 1023° and 1200° C. in a non-oxidizing gas atmosphere containing $SiCl_4$ 5 to 35% in molar fraction, and subsequently subjecting the strip to a diffusion treatment so as to uniformly diffuse Si in the steel strip in a non-oxidizing gas atmosphere not containing $SiCl_4$, in which diffusion treatment, increasing the temperature of the steel strip to an extent that the steel strip is not molten, coating, after cooling, an insulating film, baking and coiling.

26. A method of producing high silicon steel strip in a continuous line, comprising continuously siliconizing a steel strip composed of C: not more than 0.01 wt %, Si: not more than 4.0 wt %, Mn: not more than 2 wt %, the rest being Fe and unavoidable impurities by a chemical vapor deposition at temperatures between 1023° and 1200° C. in a non-oxidizing atmosphere of a gas containing $SiCl_4$ 5 to 35% in molar fraction, a pressurized stream of said gas being applied continuously to the steel surface via blowing nozzles, and subsequently subjecting the strip to a diffusion treatment so as to uniformly diffuse Si staying on the steel surface in the steel strip in a non-oxidizing gas atmosphere not containing $SiCl_4$, in which diffusion treatment, increasing the temperature of the steel strip to an extent that the steel strip is not molten, coating, after cooling, an insulating film, baking and coiling.

27. A method of producing high silicon steel strip in a continuous line, comprising continuously siliconizing a steel strip composed of C: not more than 0.01 wt %, Si: not more than 4.0 wt %, Mn: not more than 2 wt %, the rest being Fe and unavoidable impurities by a chemical vapor deposition at temperatures between 1023° and 1200° C. in a non-oxidizing gas atmosphere containing $SiCl_4$ 5 to 35% in molar fraction, while forcibly circulating the atmospheric gas by means of fans, and subsequently subjecting the strip to a diffusion treatment so as to uniformly diffuse Si in the steel strip in a non-oxidizing gas atmosphere not containing $SiCl_4$, in which diffusion treatment, increasing the temperature of the steel strip to an extent that the steel strip is not molten, coating, after cooling, an insulating film, baking and coiling.

28. The method as claimed in claim 25, 26 or 27, comprising cooling the steel strip after the diffusion treatment, and coiling it under a warming condition at temperature of not more than 300° C.

29. The method as claimed in claim 26, comprising blowing the atmospheric gas against the steel strip from the blowing nozzles at flowing speed of not more than 5 Nm/sec.

30. The method as claimed in claim 26, comprising disposing a plurality of blowing nozzles along both sides of a steel strip running line in the chemical vapor deposition treating furnace, and blowing the atmospheric gas against the running steel strip.

31. A method of producing high silicon steel strip in a continuous line, comprising continuously siliconizing a steel strip composed of C: not more than 0.01 wt %, Si: not more than 4.0 wt %, Al: 3 to 8 wt %, Ni: not more than 4 wt %, Mn: not more than 2 wt %, corrosion resistance improving elements such as Cr, Ti: not more than 5 wt % in total, the rest being Fe and inavoidable impurities by a chemical vapor deposition at temperatures between 1023° and 1200° C. in a non-oxidizing gas atmosphere containing $SiCl_4$ 5 to 35% in molar fraction, and subsequently subjecting the strip to a diffusion treatment so as to uniformly diffuse Si in the steel strip in a non-oxidizing gas atmosphere not containing $SiCl_4$, in which diffusion treatment, increasing the temperature of the steel strip to an extent that the steel strip is not molten, cooling after the diffusion treatment, coating, after cooling, an insulating film, baking and coiling.

32. A method of producing high silicon steel strip in a continuous line, comprising continuously siliconizing a steel strip composed of C: not more than 0.01 wt %, Si: not more than 4.0 wt %, Al: 3 to 8 wt %, Ni: not more than 4 wt %, Mn: not more than 2 wt %, corrosion resistance improving elements such as Cr, Ti: not more than 5 % in total, the rest being Fe and inavoidable impurities by a chemical vapor deposition at temperatures between 1023° and 1200° C. in a non-oxidizing atmosphere of a gas containing $SiCl_4$ 5 to 35% in molar fraction, a pressurized stream of said gas being applied continuously to the steel surface via blowing nozzles, and subsequently subjecting the strip to a diffusion treatment so as to uniformly diffuse Si staying on the steel surface in the steel strip in a non-oxidizing gas atmosphere not containing $SiCl_4$, in which diffusion treatment, increasing the temperature of the steel strip to an extent that the steel strip is not molten, coating, after cooling, an insulating film, baking and coiling.

33. A method of producing high silicon steel strip in a continuous line, comprising continuously siliconizing a steel strip composed of C: not more than 0.01 wt %, Si: not more than 4.0 wt %, Al: 3 to 8 wt %, Ni: not more than 4 wt %, Mn: not more than 2 wt %, corrosion resistance improving elements such as Cr, Ti: not more than 5 wt % in total, the rest being Fe and inavoidable impurities by a chemical vapor deposition at temperatures between 1023° and 1200° C. in a non-oxidizing gas atmosphere containing $SiCl_4$ 5 to 35% in molar fraction, while forcibly circulating the atmospheric gas by means of fans, and subsequently subjecting the strip to a diffusion treatment so as to uniformly diffuse Si in the steel strip in a non-oxidizing gas atmosphere not containing $SiCl_4$, in which diffusion treatment, increasing the temperature of the steel strip to an extent that the steel strip is not molten, coating, after cooling, an insulating film, baking and coiling.

34. The method as claimed in claim 31, 32 or 33, comprising cooling the steel strip after the diffusion treatment, and coiling it under a warming condition at temperature of not more than 300° C.

35. The method as claimed in claim 32, comprising blowing the atmospheric gas against the steel strip from the blowing nozzles at flowing speed of not more than 5 Nm/sec.

36. The method as claimed in claim 32, comprising disposing a plurality of blowing nozzles along both sides of a steel strip running line in the chemical vapor desposition treating furnace, and blowing the atmospheric gas against the running steel strip.

* * * * *